(12) United States Patent
We et al.

(10) Patent No.: US 11,101,220 B2
(45) Date of Patent: Aug. 24, 2021

(54) THROUGH-PACKAGE PARTIAL VIA ON PACKAGE EDGE

(71) Applicant: QUALCOMM Incorporated, San Diego, CA (US)

(72) Inventors: Hong Bok We, San Diego, CA (US); Aniket Patil, San Diego, CA (US); Jaehyun Yeon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/553,283

(22) Filed: Aug. 28, 2019

(65) Prior Publication Data

US 2021/0066197 A1 Mar. 4, 2021

(51) Int. Cl.
| | |
|---|---|
| *H01L 23/48* | (2006.01) |
| *H01L 23/538* | (2006.01) |
| *H01L 23/498* | (2006.01) |
| *H01L 21/50* | (2006.01) |
| *H01L 21/768* | (2006.01) |
| *H01L 21/60* | (2006.01) |

(52) U.S. Cl.
CPC .......... *H01L 23/5384* (2013.01); *H01L 21/50* (2013.01); *H01L 21/76802* (2013.01); *H01L 21/76877* (2013.01); *H01L 23/49816* (2013.01); *H01L 23/5385* (2013.01); *H01L 23/5386* (2013.01); *H01L 2021/60022* (2013.01)

(58) Field of Classification Search
CPC .......... H01L 23/5384; H01L 23/49816; H01L 23/5385; H01L 23/5386; H01L 21/76802
See application file for complete search history.

(56) References Cited

U.S. PATENT DOCUMENTS

| | | | | |
|---|---|---|---|---|
| 5,239,198 | A * | 8/1993 | Lin | H01L 21/56 257/691 |
| 9,721,928 | B1 * | 8/2017 | Kalandar | H01L 24/92 |
| 2013/0113110 | A1 * | 5/2013 | Lee | H01L 24/03 257/774 |
| 2014/0367841 | A1 * | 12/2014 | Huang | H01L 24/97 257/692 |
| 2017/0372989 | A1 * | 12/2017 | Kim | H01L 23/49811 |

* cited by examiner

*Primary Examiner* — Phuc T Dang
(74) *Attorney, Agent, or Firm* — Patterson & Sheridan, L.L.P.

(57) ABSTRACT

Certain aspects of the present disclosure generally relate to a chip package having through-package partial vias. An example chip package generally includes a first substrate, a second substrate, an integrated circuit die, and one or more conductive vias. The integrated circuit die is disposed between the first substrate and the second substrate. The one or more conductive vias are disposed on at least one edge of at least one of the first substrate or the second substrate and electrically coupled to at least one of the first substrate or the second substrate.

20 Claims, 9 Drawing Sheets

THROUGH-PACKAGE PARTIAL VIA ON PACKAGE EDGE

BACKGROUND

Field of the Disclosure

Certain aspects of the present disclosure generally relate to electronic circuits and, more particularly, to layout improvements for integrated circuit packages using a through-package partial via on the edge of a chip package.

Description of Related Art

As electronic devices are getting smaller and faster, the demand for integrated circuit (IC) packages with higher I/O count, faster data processing rate, and better signal integrity greatly increases. The IC package may include a die disposed on a carrier such as a laminate substrate or printed circuit board (PCB). In some applications, two or more IC packages may be stacked, one atop the other. The stacked IC packages may be referred to as a package-on-package (PoP) assembly or module. An example of a package-on-package configuration is where two or more memory packages are stacked on each other. Another example of a package-on-package configuration is where a memory package is stacked on top of a logic or processor package, which has many more ball-grid connections to the motherboard than the memory package.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include improved conductive via layouts for integrated circuit packages.

Certain aspects of the present disclosure provide a chip package. The chip package generally includes a first substrate, a second substrate, an integrated circuit die, and one or more conductive vias. The integrated circuit die is disposed between the first substrate and the second substrate. The one or more conductive vias are disposed on at least one edge of at least one of the first substrate or the second substrate and are electrically coupled to the at least one of the first substrate or the second substrate.

Certain aspects of the present disclosure provide a method of fabricating a chip package. The method generally includes disposing a first substrate above an integrated circuit die disposed above a second substrate; forming one or more cavities through at least a portion of the first substrate and at least a portion of the second substrate; plating the one or more cavities with a conductive material, wherein the one or more plated cavities are electrically coupled to at least one of the first substrate or the second substrate; and dicing through the first substrate, the second substrate, and the one or more plated cavities to form at least one edge of the chip package.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
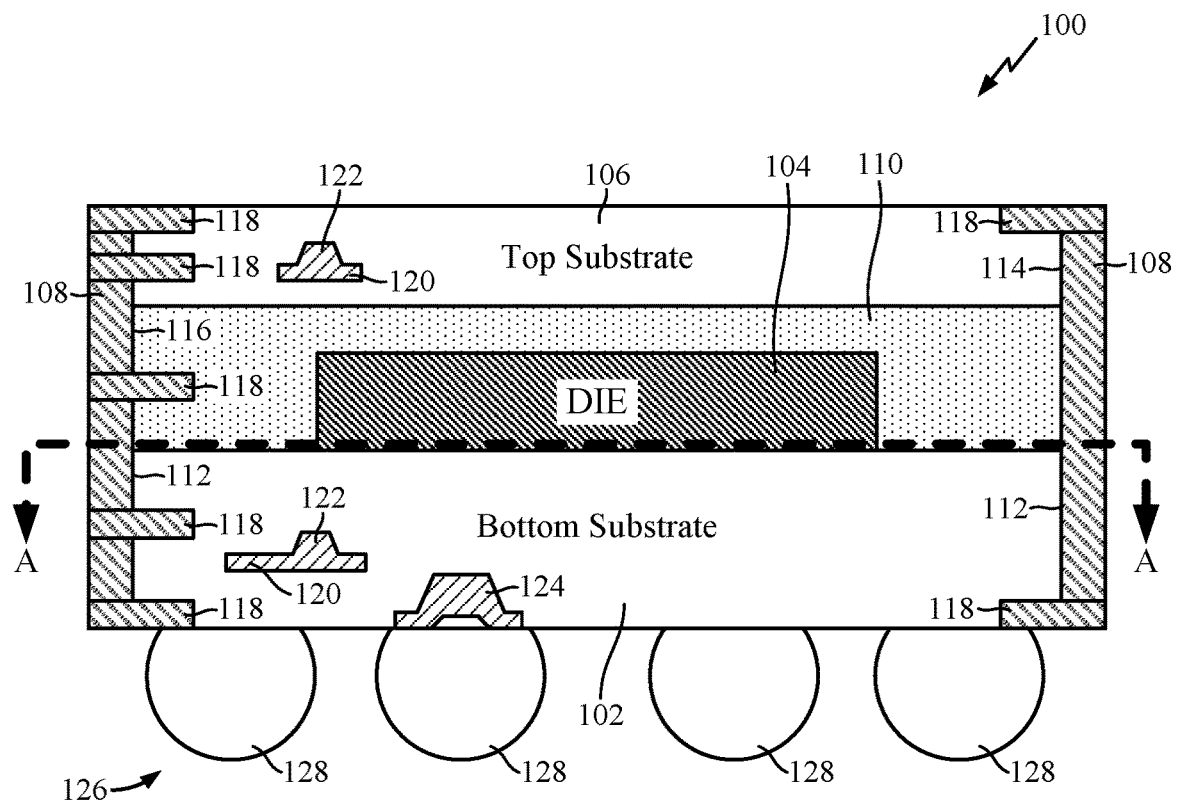
FIG. 1 is a cross-sectional view of an example chip package having through-package partial vias, in accordance with certain aspects of the present disclosure.

Aspects of the present disclosure generally relate to a chip package with improved conductive routing provided by through-package partial vias (e.g., half vias). As further described herein, the through-package partial vias may be disposed on the edge(s) of one or more substrates of a package-on-package assembly and electrically coupled to the substrates of the package-on-package assembly. The through-package partial vias may enable efficient use of floorplan space laterally adjacent to an integrated circuit die in the package-on-package assembly, improved signal integrity, and/or enhanced power integrity.

Example Chip Package with Through Package Partial Vias

In the micro-electronic technology industry, there is a continuous demand and evolution of processes, technologies, and assembly methodologies to design and implement smaller, more efficient IC packages (also referred to as a chip package). Input/output (10) counts for high speed package-on-package solutions demand an increasing number of interconnects from the bottom package to the top package. For example, a package-on-package assembly may include a bottom package and a top package disposed above the bottom package. Each of the packages may include one or more integrated circuit dies. In some cases, the top package may have a substrate that serves as an interposer for connections between one or more integrated circuit dies disposed in the bottom package and/or top package, for example, and the chip package may have power and other signals (e.g., digital signals) electrically routed from the bottom package to the top package through the substrate of the top package.

Stacked package interconnects may provide electrical routes between the bottom package and top package, for example, from the integrated circuit die(s) of the bottom package to the circuitry and/or integrated circuit die(s) of the top package, or in other cases, from a ball grid array or any of various other suitable conductor arrangements disposed below the bottom package to the top package. The stacked package interconnects (such as a conductive ball or a through mold via (TMV)) may be disposed laterally adjacent to the integrated circuit die(s) of the bottom package. With the increasing number of interconnects, the stacked package interconnects may take up vital floorplan space and reduce the space available for a die cavity of the bottom package. In other words, the space available for the die(s) on the bottom package may depend on the space used to route package interconnects that are included in the bottom package and disposed laterally adjacent to the integrated circuit die(s) of the bottom package.

Certain aspects of the present disclosure generally relate to a chip package that has through-package partial vias (e.g., half vias) disposed on an edge of the package. For example, the through-package partial vias may be formed by drilling vias through assembled substrates (e.g., a top substrate and bottom substrate of a package-on-package assembly) on a wafer before singulation. For certain aspects, the wafer may be diced along the via centers of the chip package outline such that, after dicing, a first half of each via is disposed on the package edge and a second half of each via lies in the dicing path (e.g., the kerf line). For other aspects, the wafer may be diced along the via centers of two adjacent chip package outlines such that, after dicing, a first half of each via is disposed on the package edge of one package and a second half of each via is located on the package edge of the other, adjacent package. The through-package partial vias may be electrically coupled to the bottom substrate and/or top substrate of a chip package, such as a package-on-package chip assembly. For example, the through-package partial vias may provide a routing path to electrically connect the bottom package (e.g., a ball grid array (BGA) package having an array of solder balls arranged below a bottom substrate of the bottom package) to the top package (e.g., an interposer).

In certain aspects, the through-package partial vias as described herein may provide improved floorplan space utilization. For example, the through-package partial vias may enable reduction of a chip package form factor by scaling down the space laterally adjacent to the die(s) of the bottom package due to the electrical routing on the edge(s) of the chip package. That is, the through-package partial vias may provide electrical routing between the bottom package and top package with relatively less substrate floorplan space than embedded interconnects, such as conductive balls or TMVs arranged laterally adjacent to the die(s) of the bottom package. Thus, the through-package partial vias may enable fan-out wafer-level package-on-package assemblies to scale in size relative to the die(s), resulting in a chip-scale package-on-package assembly.

Additionally or alternatively, the through-package partial vias as described herein may improve the power distribution network and/or the signal integrity of the chip package. For example, the through-package partial vias may reduce the total conductor path length from the bottom package to the top package relative to embedded interconnects. As resistance is proportional to the length of a conductor, the reduced conductor path length may enable the through-package partial vias to have a lower resistance compared to embedded interconnects, which may have additional lateral routes implemented in the chip package. In certain cases, the through-package partial vias may have fewer interfaces between conductors, which may lead to a reduced resistance compared to the embedded interconnects with multiple interfaces between conductors, such as vias, traces, conductive balls, etc.

FIG. 1 is a cross-sectional view of an example chip package 100 having through-package half vias, in accordance with certain aspects of the present disclosure. As shown, the chip package 100 may include a bottom substrate 102, an integrated circuit die 104, a top substrate 106, and one or more through-package half vias 108. The chip package 100 may be, for example, a fan-out wafer-level package-on-package assembly. Although only one integrated circuit die 104 is shown in FIG. 1, the reader is to understand that the chip package 100 may include more than one die disposed above the bottom substrate 102 and/or disposed above the top substrate 106.

In certain aspects, the chip package 100 may also include a molding compound 110 disposed between the bottom substrate 102 and the top substrate 106 and surrounding the integrated circuit die 104. For example, the molding compound 110 may be filled around the integrated circuit die 104 on the bottom substrate 102. The molding compound 110 may insulate and protect the integrated circuit die 104 in the chip package 100. The molding compound 110 may support the top substrate 106 above the integrated circuit die 104 during package fabrication. The molding compound 110 may be an epoxy resin, for example.

The bottom substrate 102 may be a wiring substrate, such as an interposer, that provides electrical routing from a ball grid array 126 (or other suitable electrical conductors) to the integrated circuit die 104 and/or the top substrate 106. The ball grid array 126 includes solder bumps 128 disposed below and electrically coupled to under bump conductors 124 of the bottom substrate 102. The solder bumps 128 may enable the chip package 100 to be electrically coupled to external circuitry, such as a circuit board (e.g., a motherboard). The bottom substrate 102 may have one or more redistribution layers that electrically couple the integrated circuit die 104 to the ball grid array 126.

The integrated circuit die 104 is disposed above the bottom substrate 102 and below the top substrate 106. In other words, the integrated circuit die 104 is disposed between the bottom substrate 102 and the top substrate 106. In certain aspects, the integrated circuit die 104 may be encapsulated in the molding compound 110. The integrated circuit die 104 may be formed on the bottom substrate 102 using a wafer-level package process, such as a fan-out wafer-level packaging process and/or a fan-in wafer-level packaging process. In some cases, the integrated circuit die 104 may be a processor, a digital signal processor (DSP), an application specific integrated circuit (ASIC), a field programmable gate array (FPGA) or other programmable logic device (PLD), discrete gate or transistor logic, discrete hardware components, or any combination thereof.

The top substrate 106 may be a wiring substrate, such as an interposer, that provides electrical routing from the bottom substrate 102 and/or integrated circuit die 104 to other electrical components (not shown) that may be disposed above the top substrate 106, such as one or more additional integrated circuit dies. The top substrate 106 may have one or more redistribution layers that electrically couple the additional integrated circuit die(s) to the ball grid array 126 and/or the integrated circuit die 104. As an example, the additional integrated circuit die(s) disposed above the top substrate 106 may include one or more high-speed I/O dies (such as memory dies). The memory dies disposed on the top substrate 106 may be accessible to the integrated circuit die 104, and thus, the package-on-package assembly may provide a processing system including a processor and memory.

Figure 2:
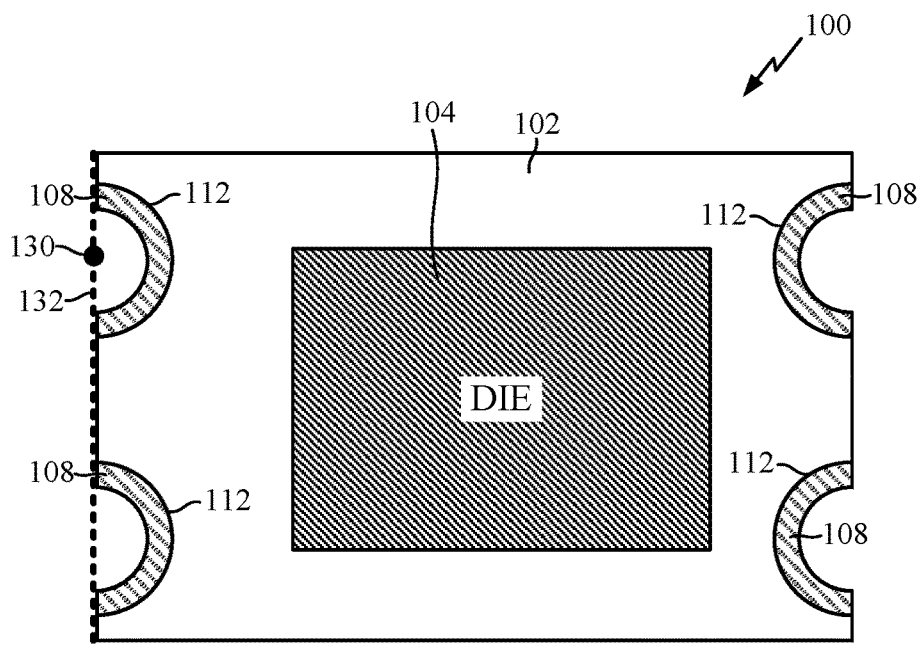
FIG. 2 is a top view of the example chip package of FIG. 1, in accordance with certain aspects of the present disclosure.

The through-package half vias 108 may include one or more conductive vias disposed on an edge 112 of the bottom substrate 102, an edge 114 of the top substrate 106, and/or an edge 116 of the molding compound 110. In certain aspects, each of the through-package half vias 108 may form a semi-circular pillar on the edge 112 of the bottom substrate 102, the edge 114 of the top substrate 106, and/or the edge 116 of the molding compound 110. The semi-circular pillar may have a cross-section that forms a circular sector (such as a half-sector or a quarter sector) or a segment of a curve or an arc, for example, as depicted in FIG. 2. As an example, the through-package half vias 108 may include halves of one or more through-hole plated vias. For certain aspects, an edge of the chip package may include a through-package partial via that is not half of a via, but may be more or less than a half via.

The through-package half vias 108 may be electrically coupled to the bottom substrate 102 and/or the top substrate 106. In some cases, the through-package half vias 108 may be electrically coupled to one or more layers of the bottom substrate 102 and/or the top substrate 106 or one or more conductors embedded in the molding compound 110. For example, the through-package half vias 108 may be electrically coupled to conductive interfaces 118 that intersect with one or more layers of the bottom substrate 102 and/or the top substrate 106. The conductive interfaces 118 may be electrically coupled to conductors embedded in the chip package 100, such as conductive traces 120, conductive vias 122, and/or under bump conductors 124.

FIG. 2 illustrates a top view of the example chip package 100 along the cross-section taken across line A-A as depicted in FIG. 1, in accordance with certain aspects of the present disclosure. As shown, the through-package half vias 108 are disposed on the edge 112 of the bottom substrate 102 and form a segment of a curve or arc. In this example, the through-package half vias 108 are disposed on a plurality of edges of the chip package, such as edges 112 of the bottom substrate. In aspects, a center 130 of at least one of the through-package half vias 108 may be on an effective edge 132 of the bottom substrate 102 and/or an effective edge (not shown) of the top substrate 106. As an example, the effective edge 132 of the bottom substrate 102 may run along a lateral surface of the bottom substrate 102.

FIGS. 3A-3D illustrate example operations for fabricating a chip package from a cross-sectional perspective, in accordance with certain aspects of the present disclosure. The operations may be performed by an integrated circuit processing facility, for example.

Figure 3A:
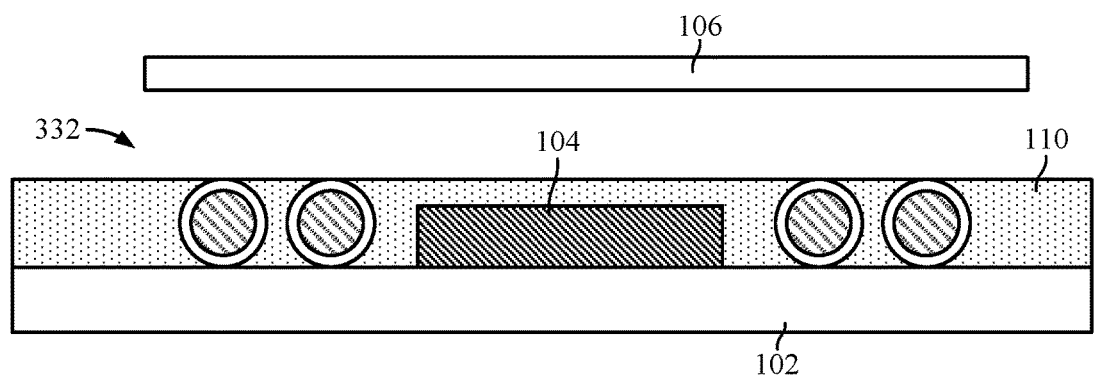
FIG. 3A is a cross-sectional view of arranging a top substrate above a wafer having a bottom substrate, in accordance with certain aspects of the present disclosure.

As shown in FIG. 3A, a bottom package 332 may be formed that includes the bottom substrate 102 and the integrated circuit die 104. As an example, the bottom package 332 may be formed using a wafer-level packaging process, such as a fan-out wafer-level packaging process and/or a fan-in wafer-level packaging process. The top substrate 106 may be separately formed through any suitable fabrication process.

Figure 3B:
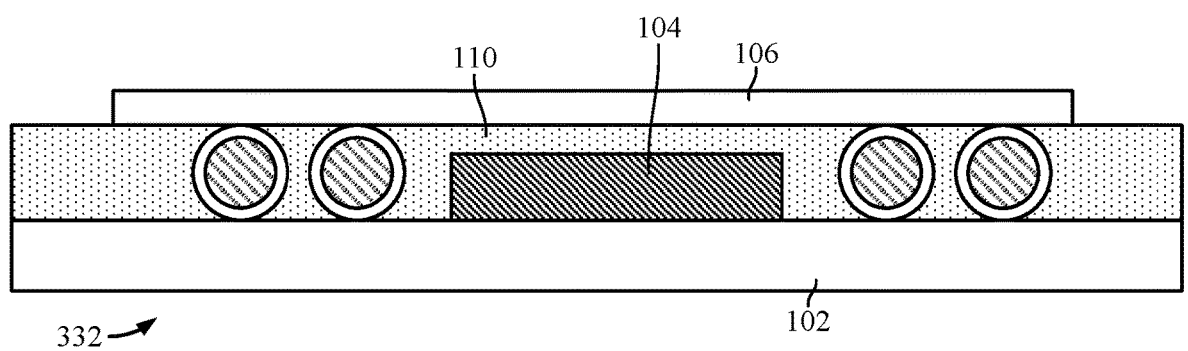
FIG. 3B is a cross-sectional view of the top substrate disposed above the bottom substrate, in accordance with certain aspects of the present disclosure.

Referring to FIG. 3B, the top substrate 106 may be disposed above the integrated circuit die 104, which is disposed above the bottom substrate 102. The top substrate 106 may be coupled to the bottom package 332 via a solder reflow process of solder balls (not shown) disposed below the top substrate 106.

Figure 3C:
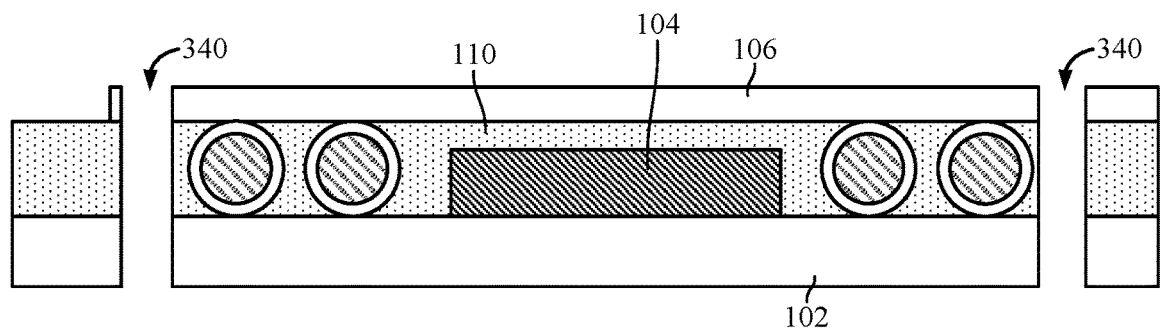
FIG. 3C is a cross-sectional view of forming cavities through the substrates, in accordance with certain aspects of the present disclosure.

As depicted in FIG. 3C, one or more cavities 340 may be formed through at least a portion of the bottom substrate 102, a portion of the top substrate 106, and a portion of the molding compound 110. The cavities 340 may be formed using any of various suitable techniques, such as forming the cavities 340 with a drill and/or a laser. The cavities 340 may be drilled between chip packages on a wafer, such that a portion of the cavities 340 intersect a chip package and the other portion of the cavities 340 intersect a dicing path (e.g., a kerf path). That is, the cavities 340 may overlap a portion of the chip package outline and a portion of a kerf path before dicing the wafer. For other aspects, the cavities 340 may straddle an outline between adjacent chip packages.

Figure 3D:
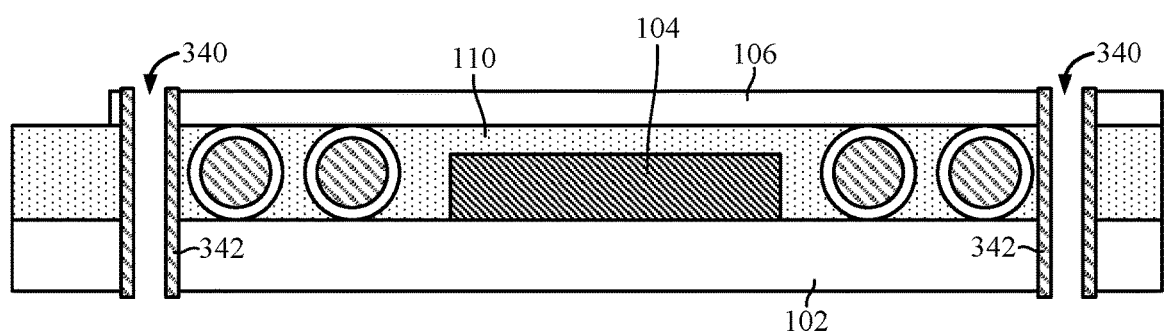
FIG. 3D is a cross-sectional view of plating the cavities with a conductive material, in accordance with certain aspects of the present disclosure.

Referring to FIG. 3D, the cavities 340 may be plated with a conductive material 342 (e.g., a copper (Cu), silver (Ag), and/or a gold (Au) plating material) to form through-package plated vias, similar to through-hole plated vias in a printed circuit board (PCB). In certain cases, the cavities 340 may only be partially filled with the conductive material producing a conductive pillar with a hollow center. The plated cavities 340 may be electrically coupled to the bottom substrate 102 and/or the top substrate 106 as described herein with respect to FIG. 1. For example, conductive interfaces (not shown in FIG. 3D), such as the conductive interfaces 118 depicted in FIG. 1, may be electrically coupled to the plated cavities 340 and various conductors embedded in the bottom and/or top substrates.

Figure 3E:
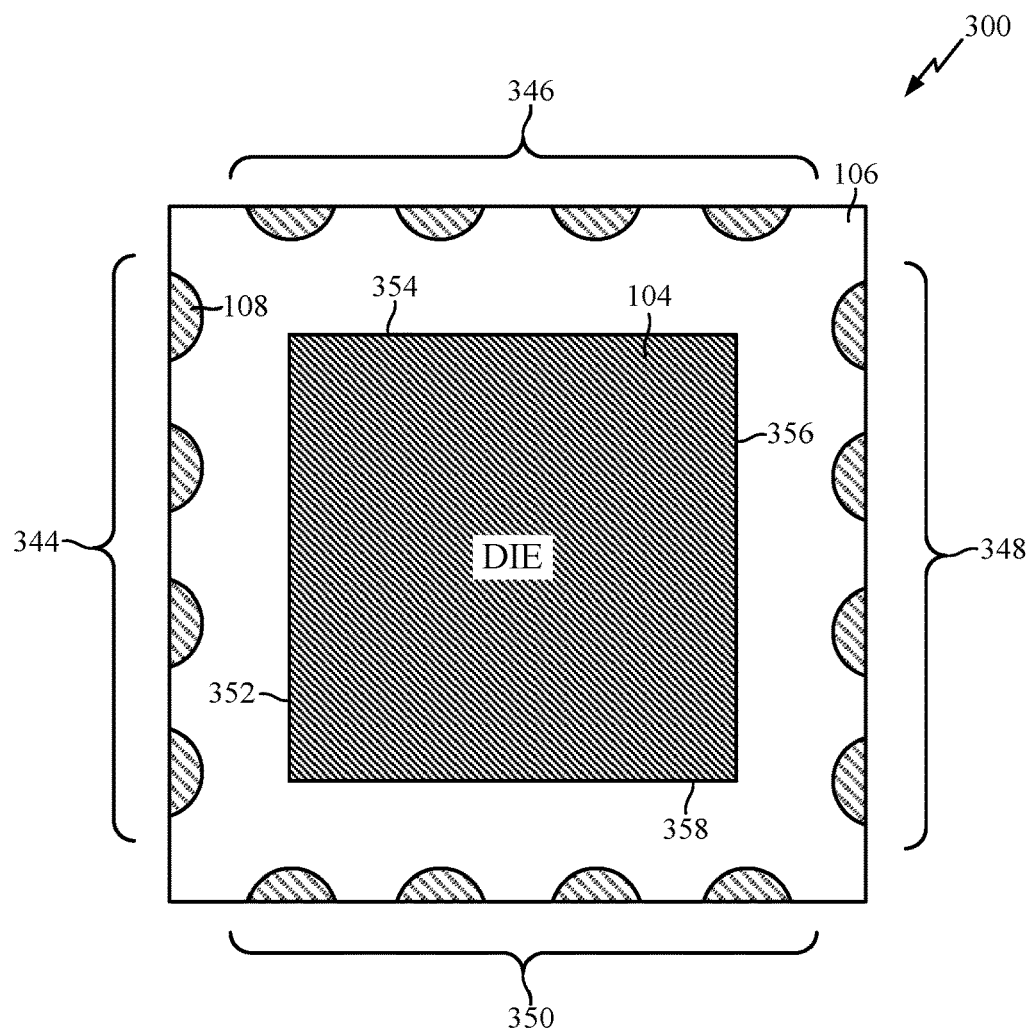
FIG. 3E is a top view an example chip package having through-package partial vias after being diced, in accordance with certain aspects of the present disclosure.

After plating the cavities 340 with the conductive material 342, the chip packages on a wafer may be diced into individual packages. For example, FIG. 3E illustrates a top view of an example chip package 300 having through-package partial vias after being diced on four sides, in accordance with certain aspects of the present disclosure. As shown, the chip package 300 may have a plurality of sets 344, 346, 348, 350 of the through-package half vias 108. Each of the sets 344, 346, 348, 350 of the through-package half vias may be disposed adjacent to a different side 352, 354, 356, 358 of the integrated circuit die 104. In certain aspects, the chip package 300 may have any number of sets of through-package half vias, each of which is disposed adjacent to a different side of the integrated circuit die.

As an example, the first set 344 of the through-package half vias 108 may be disposed adjacent to the first side 352 of the integrated circuit die 104, the second set 346 of the through-package half vias 108 may be disposed adjacent to the second side 354 of the integrated circuit die 104, the third set 348 of the through-package half vias 108 may be disposed adjacent to the third side 356 of the integrated circuit die 104, and the fourth set 350 of the through-package half vias 108 may be disposed adjacent to the fourth side 358 of the integrated circuit die 104. Each of the sides 352, 354, 356, 358 of the integrated circuit die 104 may be different from one another.

Figure 3F:
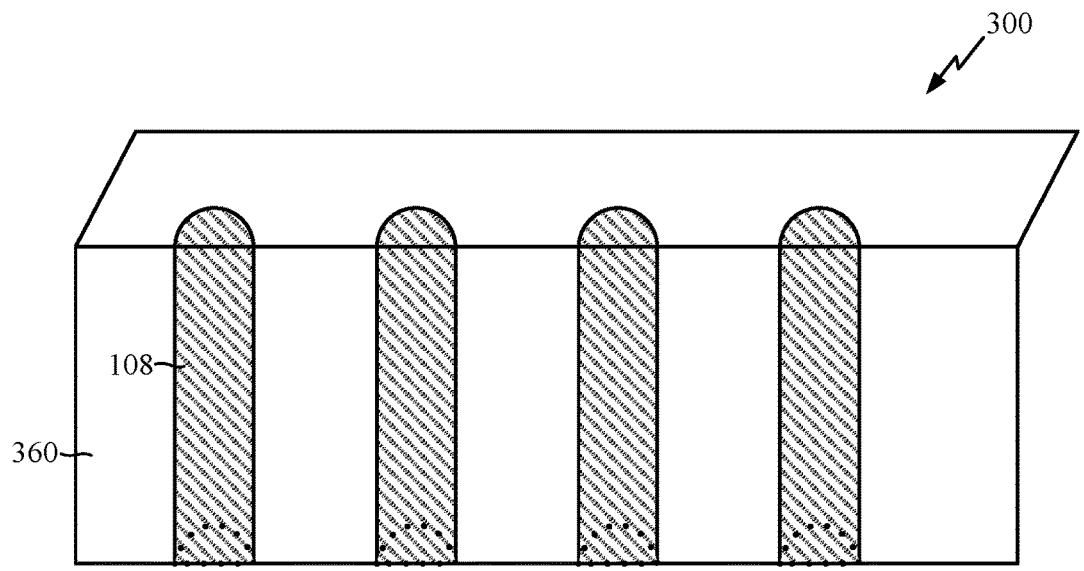
FIG. 3F is an isometric view of a side of the example chip package, in accordance with certain aspects of the present disclosure.

FIG. 3F is an isometric view of a side 360 of the example chip package 300, in accordance with certain aspects of the present disclosure. As shown, the through-package half vias 108 may extend axially along the height of the side 360, which is formed after dicing the chip package 300 from a wafer. After dicing the wafer, the through-package half vias 108 may form part of an edge of the chip package 300.

FIGS. 4A-4E illustrate example operations for fabricating chip packages at the wafer level from a top view, in accordance with certain aspects of the present disclosure. The operations may be performed by an integrated circuit processing facility, for example.

Figure 4A:
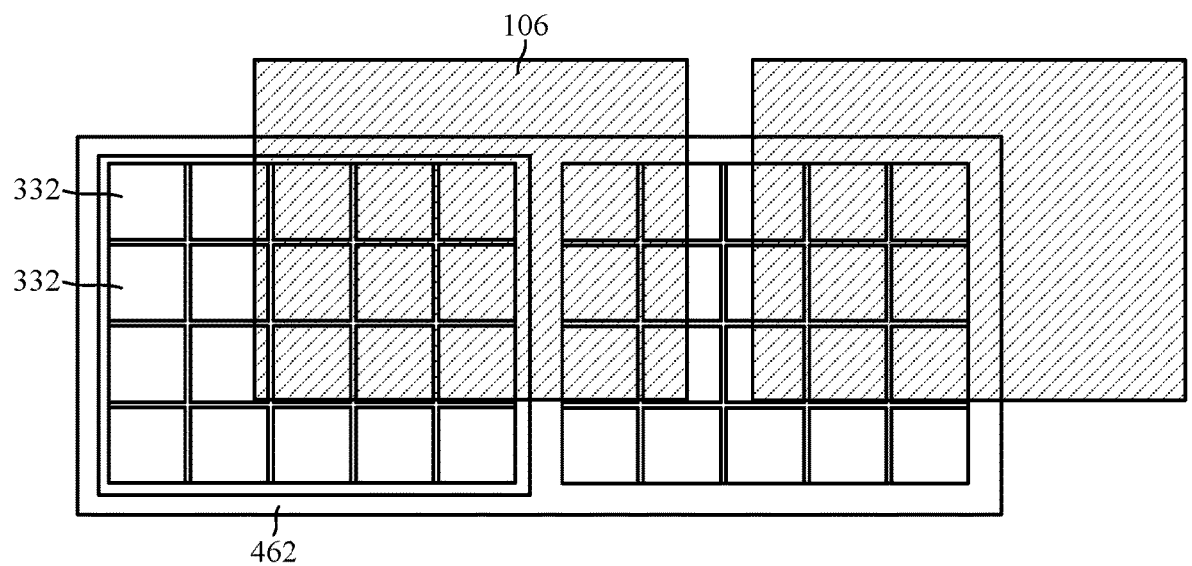
FIG. 4A is a top view of arranging a top substrate above a bottom package at a wafer level, in accordance with certain aspects of the present disclosure.

As shown in FIG. 4A, multiple bottom packages 332 may be formed on a wafer 462. For example, the bottom packages 332 may be formed using various wafer-level packaging processes such as a fan-out wafer-level packaging process and/or a fan-in wafer level packaging process. In certain aspects, the wafer 462 may be a carrier wafer that supports the bottom packages 332 during the fabrication process. The top substrate 106 may be arranged above the bottom packages 332.

Figure 4B:
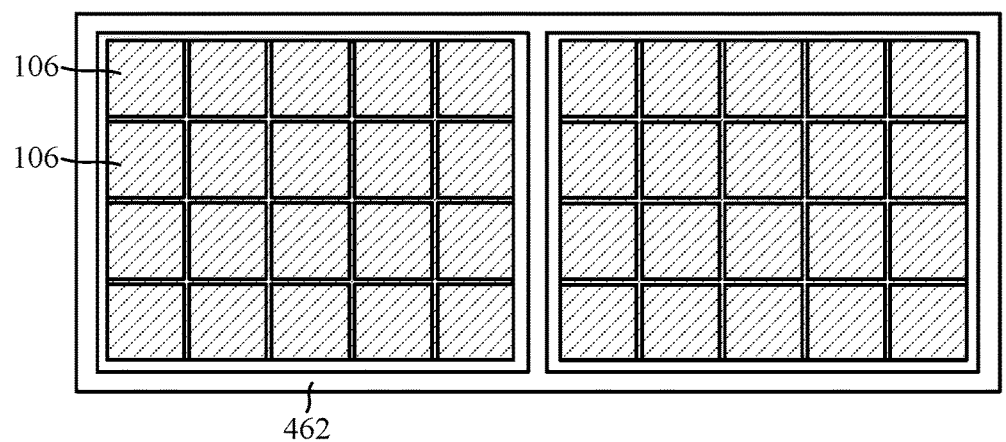
FIG. 4B is a top view of coupling the top substrate to the bottom substrate, in accordance with certain aspects of the present disclosure.

Referring to FIG. 4B, the top substrates 106 may be disposed above the integrated circuit dies (not shown) of the bottom packages 332. The top substrate 106 may be coupled to the bottom packages 332 via a solder reflow process of solder balls (not shown) disposed below the top substrate 106.

Figure 4C:
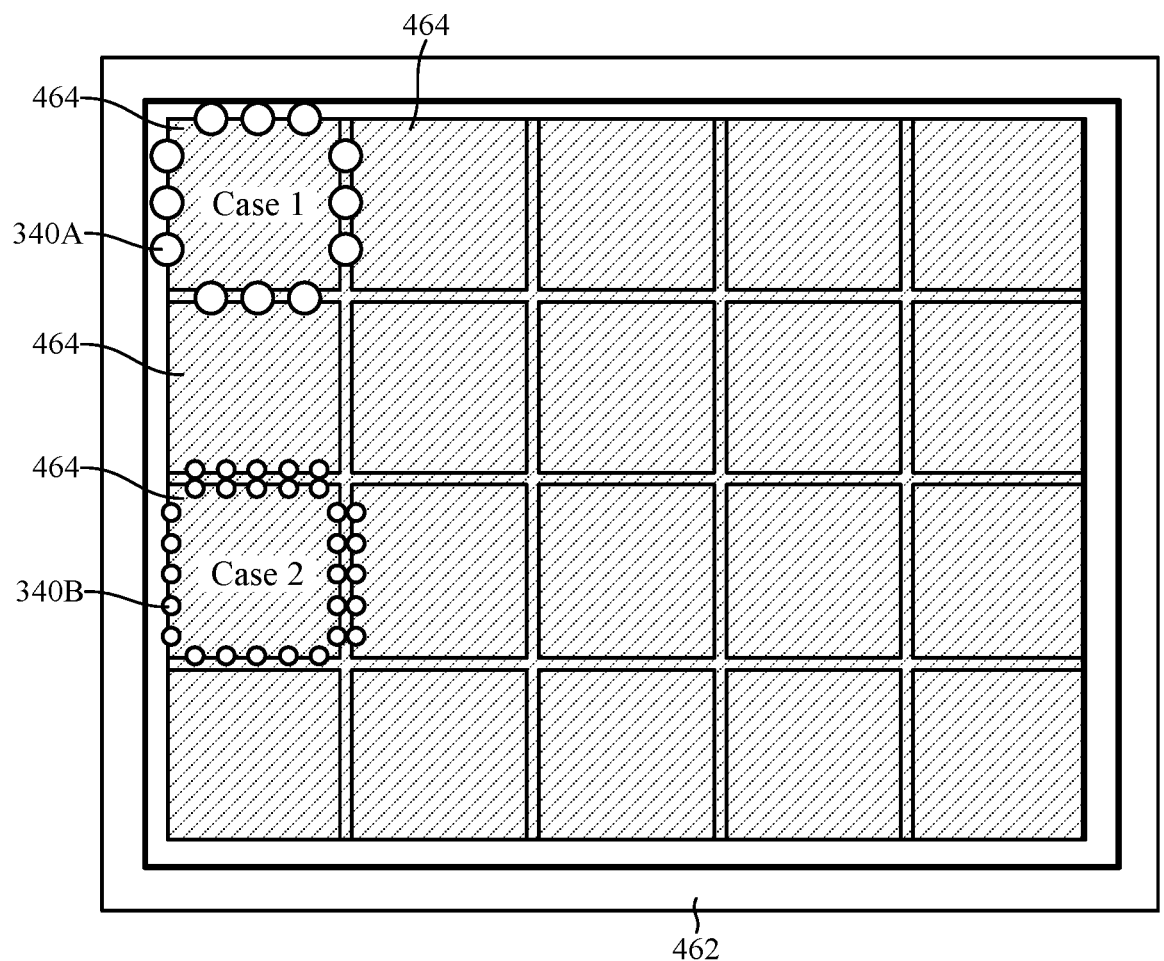
FIG. 4C is a top view of forming cavities through the substrates, in accordance with certain aspects of the present disclosure.

As illustrated in FIG. 4C, cavities 340A, 340B may be formed through the substrates of chip packages 464 on the wafer 462. The chip packages 464 may include the top substrate, bottom substrate, and integrated circuit die disposed between the substrates. In certain cases, the cavities 340A may be drilled to intersect the substrates of adjacent chip packages 464 arranged on the wafer 462. For example, one of the cavities 340A may intersect the substrates of at least two chip packages 464. In other cases, the cavities 340B may be drilled to intersect the substrates of a chip package 464 without intersecting the substrates of other chip packages 464. That is, the chip packages 464 on the wafer 462 may be drilled with separate cavities 340B that do not overlap or intersect other chip packages 464.

Figure 4D:
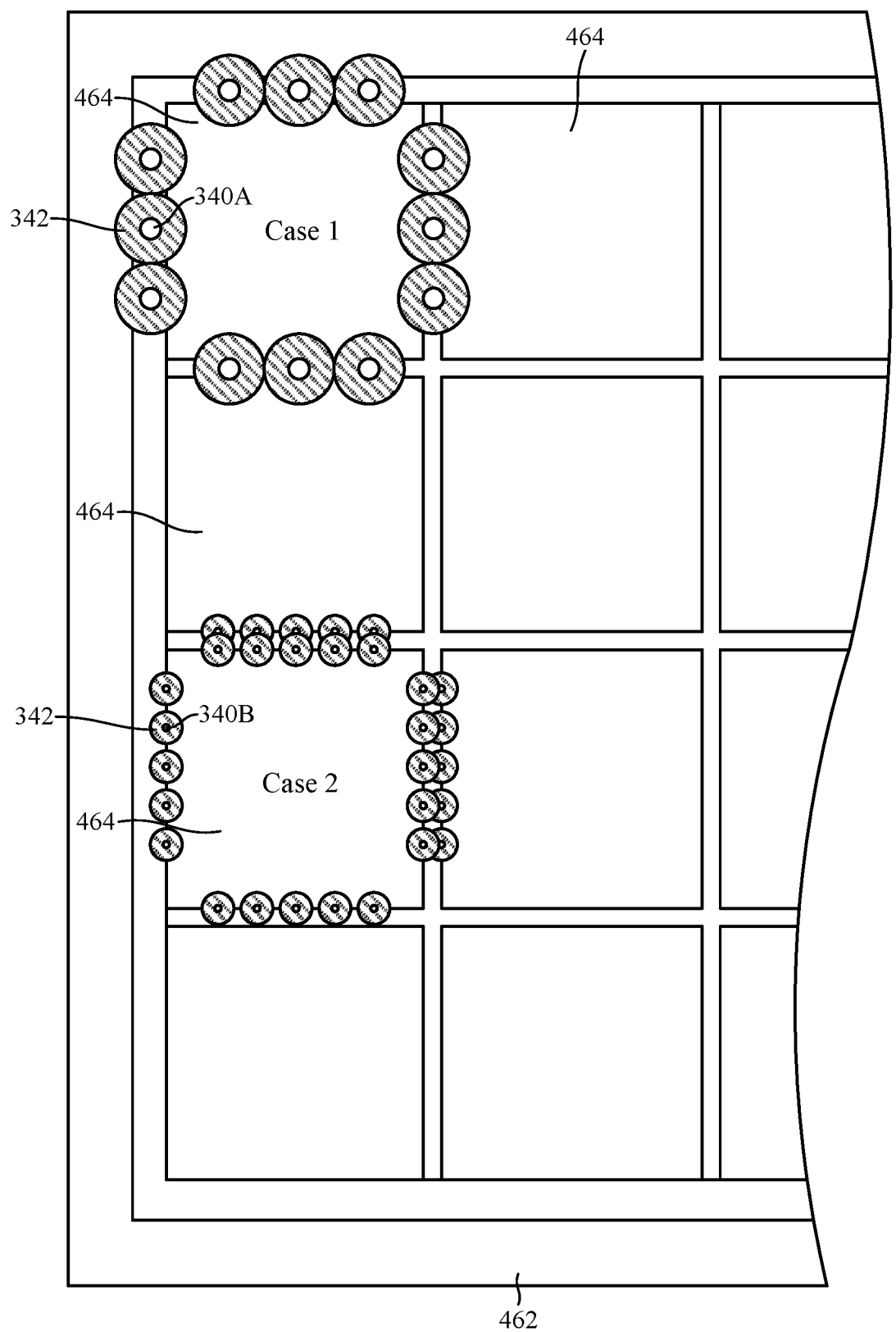
FIG. 4D is a top view of plating the cavities with a conductive material, in accordance with certain aspects of the present disclosure.
Figure 4E:
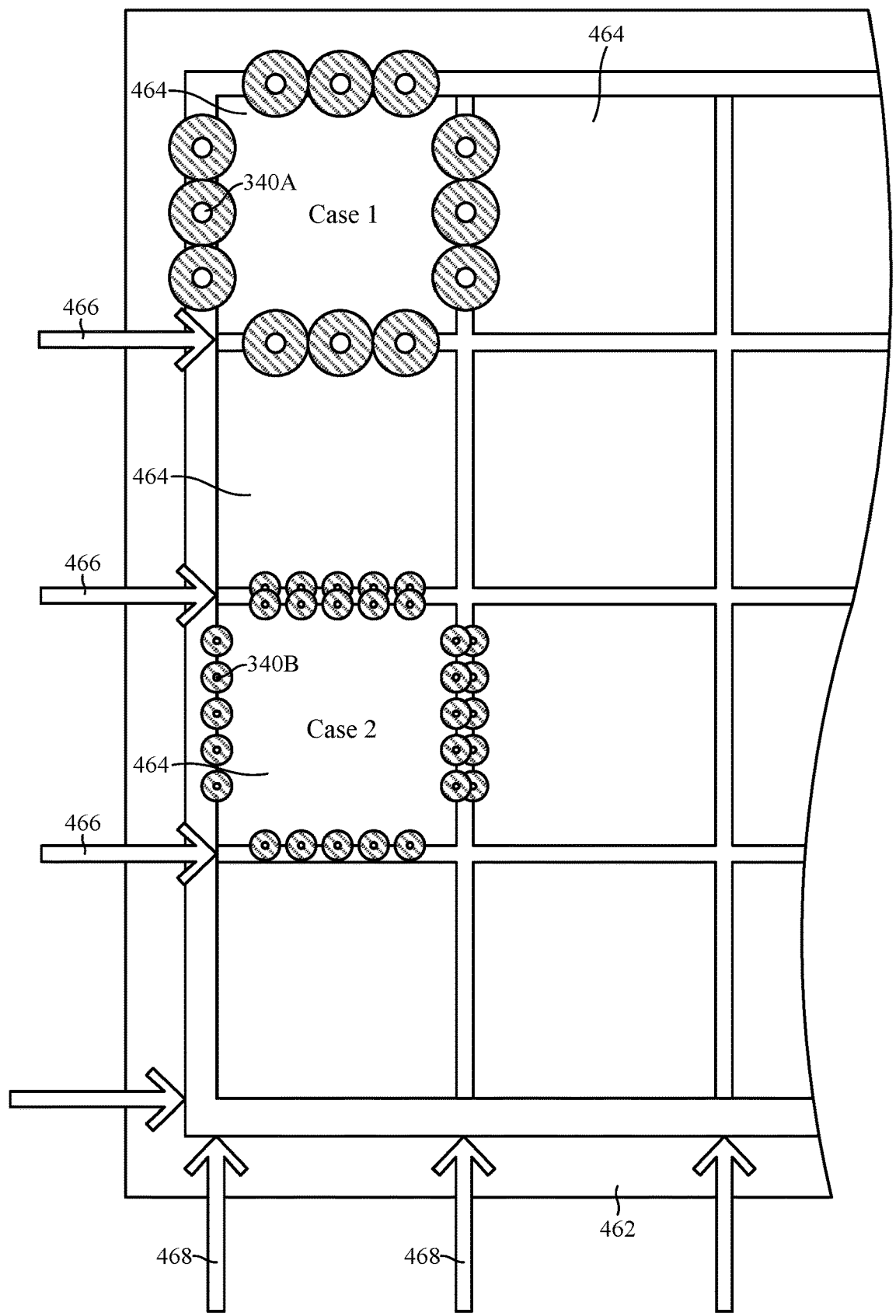
FIG. 4E is a top view of chip packages arranged on a wafer depicting example kerf lines, in accordance with certain aspects of the present disclosure.

Referring to FIG. 4D, the cavities 340A, 340B of the chip packages 464 may be plated with a conductive material 342 (e.g., copper (Cu) and/or gold (Au) plating materials). As depicted in FIG. 4E, the chip packages 464 arranged on the wafer 462 may be diced into individual chip packages along kerf lines 466, 468. For instance, the wafer 462 may be diced along horizontal kerf lines 466 and vertical kerf lines 468 that intersect the horizontal kerf lines 466. The kerf lines 466, 468 may also intersect the plated cavities 340A, 340B to form the through-package partial vias as described herein, for example, with respect FIGS. 1, 2, and 3F. The wafer 462 may be diced along the kerf lines 466, 468 to form the edges the chip packages 464.

Figure 5:
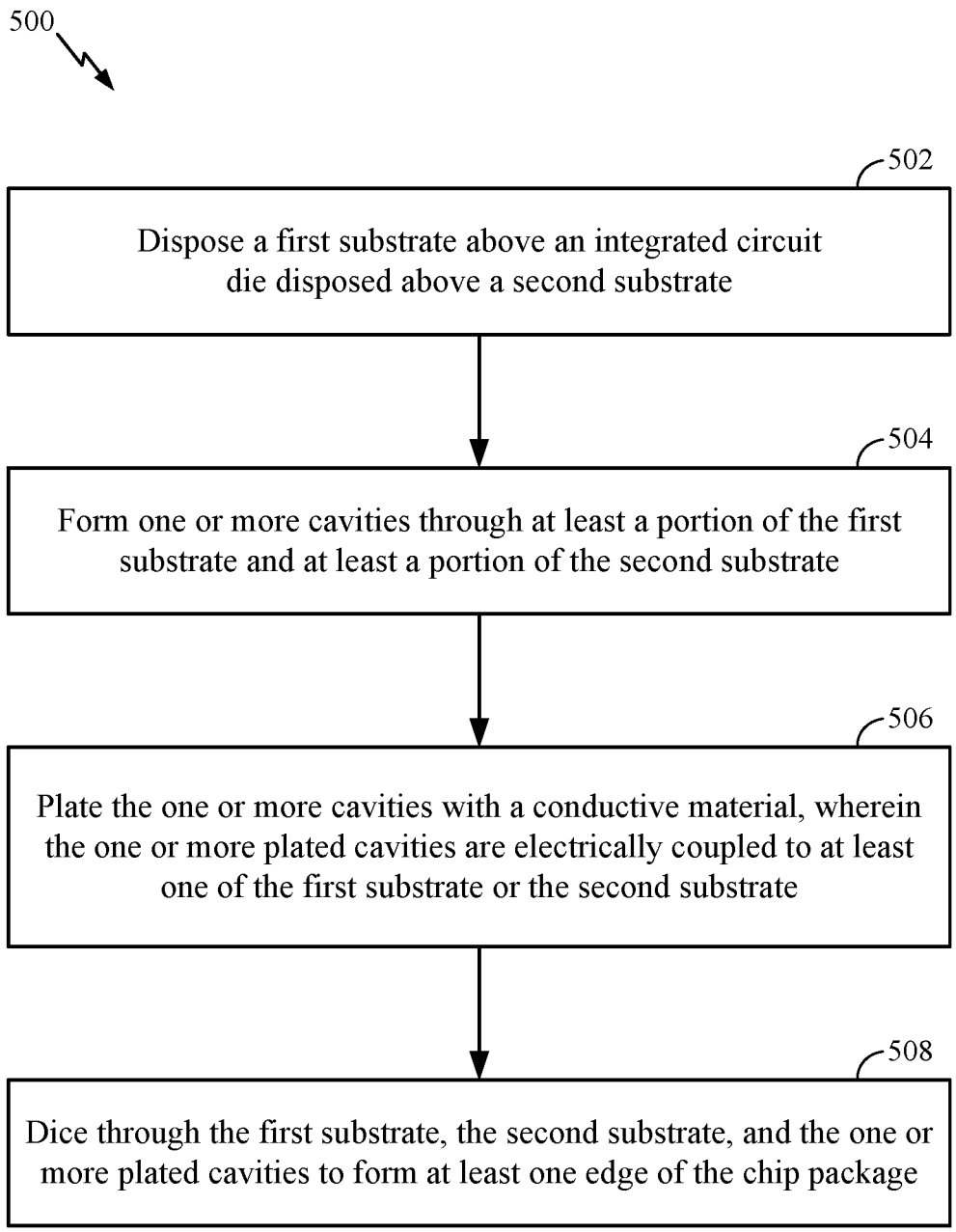
FIG. 5 is a flow diagram of example operations for fabricating a chip package, in accordance with certain aspects of the present disclosure.

FIG. 5 is a flow diagram of example operations 500 for fabricating a chip package (e.g., the chip package 100 of FIG. 1), in accordance with certain aspects of the present disclosure. The operations 500 may be performed by an integrated circuit packaging facility, for example.

The operations 500 begin, at block 502, by disposing a first substrate (e.g., the top substrate 106) above an integrated circuit die (e.g., the integrated circuit die 104) that is disposed above a second substrate (e.g., the bottom substrate 102). At block 504, one or more cavities (e.g., the cavities 340 of FIG. 3C or the cavities 340A, 340B of FIG. 4C) may be formed through at least a portion of the first substrate and at least a portion of the second substrate. At block 506, the one or more cavities may be plated with a conductive material (e.g., the conductive material 342). The one or more plated cavities are electrically coupled to at least one of the first substrate or the second substrate. At block 508, the first substrate, the second substrate, and the one or more plated cavities may be diced through to form at least one edge of the chip package.

In certain aspects, the operations 500 may also include forming a ball grid array (e.g., the ball grid array 126) disposed below the second substrate. In aspects, the one or more plated cavities may be electrically coupled to the ball grid array. For instance, a plated cavity may be electrically coupled to the ball grid array via conductive interfaces, such as the conductive interfaces 118 depicted in FIG. 1.

In certain aspects, dicing the first substrate, the second substrate, and the one or more plated cavities may include dicing a wafer (e.g., the wafer 462) comprising the first substrate, the second substrate, and the one or more plated cavities as described herein, for example, with respect to FIG. 4E. For instance, dicing through the one or more plated cavities may form through-package partial vias disposed on the at least one edge of the chip package. Each of the through-package partial vias may form a semi-circular portion of a hollow pillar on the edge of the chip package, for example, as depicted in FIG. 2. After dicing at block 508, the plated cavities may include halves of one or more through-hole plated vias.

In certain aspects, the cavities may be formed at block 504 by drilling through a portion of the first substrate and a portion of the second substrate. The cavities may be drilled along and intersect kerf lines of a wafer, such as the kerf lines 466, 468. In some cases, the cavities (e.g., the cavities 340A) may intersect the substrates of adjacent chip package(s) arranged on a wafer. For example, each of the one or more plated cavities may intersect the first substrate and the second substrate of the chip package of operations 500 and an adjacent chip package on the wafer before dicing is performed at block 508. In other cases, the cavities (e.g., the cavities 340B) may be drilled to intersect the substrates of the chip package of operations 500 without intersecting the substrates of other chip packages on the wafer before dicing the wafer at block 508.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A chip package, comprising:
   a first substrate;
   a second substrate;
   an integrated circuit die disposed between the first substrate and the second substrate;
   one or more conductive vias disposed on at least one edge of at least one of the first substrate or the second substrate and electrically coupled to at least one of the first substrate or the second substrate; and
   a molding compound disposed between the first substrate and the second substrate and surrounding the integrated circuit die, wherein the at least one edge of the at least one of the first substrate or the second substrate comprises an edge of the first substrate, an edge of the molding compound, and an edge of the second substrate.

2. The chip package of claim 1, further comprising a ball grid array disposed below the second substrate, wherein the one or more conductive vias are electrically coupled to the ball grid array.

3. The chip package of claim 1, wherein each of the one or more conductive vias forms a semi-circular pillar on the at least one edge of the at least one of the first substrate or the second substrate.

4. The chip package of claim 1, wherein a center of at least one of the conductive vias is on the at least one edge of the at least one of the first substrate or the second substrate.

5. The chip package of claim 1, wherein the one or more conductive vias comprise a conductive via electrically coupled to one or more layers of the at least one of the first substrate or the second substrate.

6. The chip package of claim 1, wherein the one or more conductive vias comprise a plurality of conductive vias disposed on a plurality of edges of the chip package.

7. The chip package of claim 1, wherein the one or more conductive vias comprise halves of one or more through-hole plated vias.

8. The chip package of claim 1, wherein:
   the one or more conductive vias comprise a plurality of sets of the one or more conductive vias, and each of the sets of the one or more conductive vias is disposed adjacent to a different side of the integrated circuit die.

9. The chip package of claim 1, wherein the one or more conductive vias comprise one or more plated cavities.

10. A method of fabricating a chip package, comprising:
    forming an integrated circuit die disposed between a first substrate and above a second substrate; and
    forming one or more conductive vias disposed on at least one edge of at least one of the first substrate or the second substrate and electrically coupled to at least one of the first substrate or the second substrate, wherein forming the one or more conductive vias comprises:
      forming one or more cavities through at least a portion of the first substrate and at least a portion of the second substrate;
      plating the one or more cavities with a conductive material, wherein the one or more plated cavities are electrically coupled to at least one of the first substrate or the second substrate; and
      dicing through the first substrate, the second substrate, and the one or more plated cavities to form at least one edge of the chip package, wherein dicing through the one or more plated cavities forms the one or more conductive vias disposed on the at least one edge of the chip package.

11. The method of claim 10, further comprising forming a ball grid array on the second substrate, wherein the one or more conductive vias are electrically coupled to the ball grid array.

12. The method of claim 10, wherein each of the one or more conductive vias forms a semi-circular pillar on the at least one edge of the chip package.

13. The method of claim 10, wherein each of the one or more plated cavities intersects the first substrate and the second substrate of the chip package and an adjacent chip package before the dicing.

14. The method of claim 10, wherein each of the one or more cavities intersects the first substrate and the second substrate of the chip package without intersecting an adjacent chip package before the dicing.

15. The method of claim 10, wherein forming the one or more cavities comprises drilling through the at least the portion of the first substrate and the at least the portion of the second substrate.

16. The method of claim 10, wherein the one or more plated cavities comprise halves of one or more through-hole plated vias.

17. A chip package, comprising:
- a first substrate;
- a second substrate;
- an integrated circuit die disposed between the first substrate and the second substrate; and
- one or more conductive vias disposed on at least one edge of at least one of the first substrate or the second substrate and electrically coupled to at least one of the first substrate or the second substrate, wherein the one or more conductive vias comprise a plurality of sets of the one or more conductive vias and wherein each of the sets of the one or more conductive vias is disposed adjacent to a different side of the integrated circuit die.

18. The chip package of claim 17, further comprising a molding compound disposed between the first substrate and the second substrate and surrounding the integrated circuit die, wherein the one or more conductive vias are disposed on an edge of the molding compound.

19. The chip package of claim 17, wherein the one or more conductive vias comprise halves of one or more through-hole plated vias.

20. The chip package of claim 17, wherein the one or more conductive vias comprise a conductive via electrically coupled to one or more layers of the at least one of the first substrate or the second substrate.

* * * * *